United States Patent
Xu

(10) Patent No.: US 10,073,308 B2
(45) Date of Patent: Sep. 11, 2018

(54) MANUFACTURE METHOD OF IPS TFT-LCD ARRAY SUBSTRATE AND IPS TFT-LCD ARRAY SUBSTRATE

(71) Applicant: Shenzhen China Star Optoelectronics Technology Co., Ltd., Shenzhen (CN)

(72) Inventor: Xiangyang Xu, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 245 days.

(21) Appl. No.: 15/026,254

(22) PCT Filed: Feb. 25, 2016

(86) PCT No.: PCT/CN2016/074503
§ 371 (c)(1),
(2) Date: Mar. 31, 2016

(87) PCT Pub. No.: WO2017/121009
PCT Pub. Date: Jul. 20, 2017

(65) Prior Publication Data
US 2018/0059492 A1   Mar. 1, 2018

(30) Foreign Application Priority Data
Jan. 11, 2016 (CN) .......................... 2016 1 0016787

(51) Int. Cl.
*H01L 27/12* (2006.01)
*G02F 1/1343* (2006.01)
(Continued)

(52) U.S. Cl.
CPC ...... *G02F 1/134363* (2013.01); *G02F 1/1368* (2013.01); *G02F 1/13439* (2013.01);
(Continued)

(58) Field of Classification Search
CPC . H01L 27/12; H01L 27/1214; H01L 28/1288; H01L 21/02271; H01L 21/02592;
(Continued)

(56) References Cited

U.S. PATENT DOCUMENTS

2004/0001174 A1* 1/2004 Doi ................... G02F 1/133553
349/113
2008/0171409 A1* 7/2008 Cheng .................... H01L 29/04
438/160
(Continued)

FOREIGN PATENT DOCUMENTS

CN    1881051 A    12/2006

*Primary Examiner* — Phuc Dang
(74) *Attorney, Agent, or Firm* — Leong C. Lei

(57) ABSTRACT

The present invention provides a manufacture method of an IPS TFT-LCD array substrate and an IPS TFT-LCD array substrate. In the manufacture method of the IPS TFT-LCD array substrate, the pixel electrode and the common electrode are manufactured with the same transparent conductive layer, and a plurality of strip shape channels parallel with one another in the pixel area are provided on the insulation protective layer below the pixel electrode and the common electrode, and the pixel electrode and the common electrode are alternately distributed along bosses at two sides of the channels and extend to side walls of the channels, and thus to increase the areas of the pixel electrode and the common electrode in the direction vertical to the substrate, and to increase the horizontal electrical field, and meanwhile to increase the storage capacitor, and thus to promote the display quality of the liquid crystal panel.

11 Claims, 8 Drawing Sheets

(51) Int. Cl.

| | |
|---|---|
| *H01L 21/77* | (2017.01) |
| *G02F 1/1362* | (2006.01) |
| *G02F 1/1368* | (2006.01) |
| *H01L 21/02* | (2006.01) |
| *H01L 21/027* | (2006.01) |
| *H01L 21/285* | (2006.01) |
| *H01L 21/306* | (2006.01) |
| *H01L 21/308* | (2006.01) |
| *H01L 21/311* | (2006.01) |
| *H01L 21/3213* | (2006.01) |
| *H01L 29/423* | (2006.01) |
| *H01L 29/45* | (2006.01) |
| *H01L 29/49* | (2006.01) |
| *H01L 29/51* | (2006.01) |
| *H01L 29/66* | (2006.01) |
| *H01L 29/786* | (2006.01) |

(52) U.S. Cl.
CPC .. *G02F 1/136213* (2013.01); *G02F 1/136227* (2013.01); *G02F 1/136286* (2013.01); *H01L 21/0217* (2013.01); *H01L 21/0262* (2013.01); *H01L 21/0274* (2013.01); *H01L 21/02271* (2013.01); *H01L 21/02532* (2013.01); *H01L 21/02592* (2013.01); *H01L 21/2855* (2013.01); *H01L 21/3081* (2013.01); *H01L 21/30604* (2013.01); *H01L 21/31116* (2013.01); *H01L 21/31144* (2013.01); *H01L 21/32134* (2013.01); *H01L 21/32139* (2013.01); *H01L 21/77* (2013.01); *H01L 27/12* (2013.01); *H01L 27/124* (2013.01); *H01L 27/127* (2013.01); *H01L 27/1222* (2013.01); *H01L 27/1248* (2013.01); *H01L 27/1255* (2013.01); *H01L 27/1262* (2013.01); *H01L 27/1288* (2013.01); *H01L 29/42364* (2013.01); *H01L 29/42372* (2013.01); *H01L 29/42384* (2013.01); *H01L 29/458* (2013.01); *H01L 29/4908* (2013.01); *H01L 29/518* (2013.01); *H01L 29/66765* (2013.01); *H01L 29/78669* (2013.01); *H01L 29/78696* (2013.01); *G02F 2001/136295* (2013.01); *G02F 2201/121* (2013.01); *G02F 2201/122* (2013.01); *G02F 2201/123* (2013.01); *G02F 2202/103* (2013.01)

(58) Field of Classification Search
CPC . G02F 1/134363; G02F 1/136213; G03F 7/20
See application file for complete search history.

(56) References Cited

U.S. PATENT DOCUMENTS

| | | | |
|---|---|---|---|
| 2010/0032664 A1* | 2/2010 | Lee | H01L 27/1225 257/43 |
| 2010/0301311 A1* | 12/2010 | Oku | H01L 51/0529 257/40 |
| 2011/0305882 A1* | 12/2011 | Kim | H01L 27/1214 428/195.1 |
| 2014/0252328 A1* | 9/2014 | Takamatsu | H01L 51/524 257/40 |
| 2015/0221669 A1* | 8/2015 | Sun | H01L 29/66765 257/72 |
| 2015/0348999 A1* | 12/2015 | Guo | H01L 27/1288 438/151 |
| 2016/0097958 A1* | 4/2016 | Lee | G02F 1/136286 349/43 |
| 2016/0141531 A1* | 5/2016 | Fukushima | H01L 51/0545 257/40 |
| 2016/0358948 A1* | 12/2016 | Wang | H01L 27/124 |

* cited by examiner

MANUFACTURE METHOD OF IPS TFT-LCD ARRAY SUBSTRATE AND IPS TFT-LCD ARRAY SUBSTRATE

FIELD OF THE INVENTION

The present invention relates to a display technology field, and more particularly to a manufacture method of an IPS TFT-LCD array substrate and an IPS TFT-LCD array substrate.

BACKGROUND OF THE INVENTION

With the development of display technology, the Thin Film Transistor Liquid Crystal Display (TFT-LCD), such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a liquid crystal display panel and a back light module. The working principle of the liquid crystal display panel is to locate liquid crystal molecules between two parallel glass substrates, and a plurality of vertical and horizontal tiny electrical wires are between the two glass substrates. The light of back light module is reflected to generate images by applying driving voltages to control whether the liquid crystal molecules to be changed directions. Generally, the liquid crystal display panel comprises a CF (Color Filter) substrate, an array substrate, LC (Liquid Crystal) sandwiched between the CF substrate and TFT substrate and sealant. The formation process generally comprises: a forepart Array process (thin film, photo, etching and stripping), a middle Cell process (Lamination of the array substrate and the CF substrate) and a post module assembly process (Attachment of the driving IC and the printed circuit board). The forepart Array process is mainly to form the array substrate for controlling the movement of the liquid crystal molecules; the middle Cell process is mainly to add liquid crystal between the array substrate and the CF substrate; the post module assembly process is mainly the driving IC attachment and the integration of the printed circuit board. Thus, the liquid crystal molecules are driven to rotate and display pictures.

The liquid crystal panel array substrate comprises a plurality of scan lines, a plurality of data lines and a plurality of common electrode lines. The plurality of scan lines and the plurality of data lines define a plurality of pixel units. Each pixel unit comprises a thin film transistor and a pixel electrode. The gate of the thin film transistor is coupled to the corresponding gate line. As the voltage of the gate line reaches the activation voltage, the source and the drain are conducted, and the data voltage of the data line is inputted to the pixel electrode.

For the TFT-LCD in the mainstream market, three types, which can be categorized according to the driving modes of the liquid crystal, respectively are Twisted Nematic (TN), Super Twisted Nematic (STN), In-Plane Switching (IPS) and Vertical Alignment (VA). The IPS mode utilizes the electric field which is roughly parallel with the substrate surface to drive the liquid crystal molecules twisting along the substrate surface for response, and thus possesses excellent view angle property. Therefore, it is applied in kinds of TV display applications.

In the IPS mode, the parallel electrical field generated by the edges of the pixel electrode and the common electrode and the vertical electrical field generated between the pixel electrode and the common electrode forms a multi-dimensional electrical field. Then, all the aligned liquid crystal molecules among the pixel electrodes, or among the common electrodes in the cell, right above the pixel electrodes or right above the common electrodes can generate rotation and conversion. Accordingly, the working efficiency of the plane orientated liquid crystal can be promoted and the transmission efficiency can be increased. As shown in FIG. 1, which is the structure of the IPS TFT-LCD array substrate according to prior art, each pixel unit comprises a gate 101 located on the substrate 100, a gate isolation layer 102 located on the gate 101 and the substrate 100, a semiconductor layer 103 located on the gate isolation layer 102, a source 104, a drain 105 located on the semiconductor layer 103 and the gate isolation layer 102, an insulation protective layer 106 located on the source 104, the drain 105, the semiconductor layer 103 and the gate isolation layer 102, and a pixel electrode 107 located on the insulation protective layer 106; moreover, in the array substrate, the common electrode layer 120, the gate 101 and the gate scan lines 110 are manufactured with the same metal layer, and the pixel electrode 107 is coupled to the drain 105 through the via structure in the insulation protective layer 106.

However, as the progress of the technology, the consumer gives the higher request for the display result of the electronic products. People are constantly chasing the display elements having the better display result and the higher transmission ratio.

SUMMARY OF THE INVENTION

An objective of the present invention is to provide a manufacture method of an IPS TFT-LCD array substrate, in which the pixel electrode and the common electrode are manufactured with the same transparent conductive layer, and a plurality of strip shape channels parallel with one another in the pixel area are provided on the insulation protective layer below the pixel electrode and the common electrode, and the pixel electrode and the common electrode are alternately distributed along bosses at two sides of the channels and extend to side walls of the channels, and thus to increase the areas of the pixel electrode and the common electrode in the direction vertical to the substrate, and to increase the horizontal electrical field for increasing the storage capacitor and promoting the display quality of the liquid crystal panel.

Another objective of the present invention is to further provide an IPS TFT-LCD array substrate, in which a plurality of strip shape channels parallel with one another in the pixel area are provided on the insulation protective layer below the pixel electrode and the common electrode, and the pixel electrode and the common electrode are alternately distributed along bosses at two sides of the channels and extend to side walls of the channels, and thus to increase the areas of the pixel electrode and the common electrode in the direction vertical to the substrate, and to increase the horizontal electrical field for increasing the storage capacitor and promoting the display quality of the liquid crystal panel.

For realizing the aforesaid objective, the present invention provides a manufacture method of an IPS TFT-LCD array substrate, comprising steps of:

step 1, providing a substrate, and depositing a gate metal layer on the substrate, and patterning the gate metal layer to obtain a gate and a gate scan line;

step 2, depositing a gate isolation layer on the gate metal layer, and depositing an amorphous silicon layer on the gate isolation layer, and patterning the amorphous silicon layer after performing N-type doping to the amorphous silicon layer to obtain a semiconductor layer correspondingly above the gate;

step 3, depositing a source-drain metal layer on the semiconductor layer and the gate isolation layer, and patterning the source-drain metal layer to obtain a source, a drain and a data line, and the source and the drain respectively contact with two ends of the semiconductor layer; wherein the data line and the gate scan line crisscross to form a plurality of pixel areas;

step 4, forming an insulation protective layer on the source-drain metal layer, and patterning the insulation protective layer, and forming a via located correspondingly above the drain and a plurality of strip shape channels parallel with one another in the pixel area on the insulation protective layer;

step 5, depositing a transparent conductive layer on the insulation protective layer, and patterning the transparent conductive layer to obtain a pixel electrode and a common electrode, and the pixel electrode contacts with the drain through the via, and the pixel electrode and the common electrode are separately located, and in each pixel area, the pixel electrode and the common electrode are alternately distributed along bosses at two sides of the channels and extend to side walls of the channels.

The gate metal layer is deposited by physical vapor deposition in the step 1, and a film thickness of the deposited gate metal layer is 3000-6000 Å, and material of the gate metal layer is a stack combination of one or more of molybdenum, titanium, aluminum and copper; the step of patterning the gate metal layer comprises photoresist coating, exposure, development, wet etching and photoresist stripping in order.

The gate isolation layer and the amorphous silicon layer are deposited by plasma enhancement chemical vapor deposition in the step 2, and a film thickness of the deposited gate isolation layer is 2000-5000 Å, and a film thickness of the deposited amorphous silicon layer is 1500-3000 Å, and the gate isolation layer is a silicon nitride layer, and the step of patterning the amorphous silicon layer comprises photoresist coating, exposure, development, wet etching and photoresist stripping in order.

The source-drain metal layer is deposited by physical vapor deposition in the step 3, and a film thickness of the deposited gate metal layer is 3000-6000 Å, and material of the source-drain metal layer is a stack combination of one or more of molybdenum, titanium, aluminum and copper; the step of patterning the source-drain metal layer comprises photoresist coating, exposure, development, wet etching and photoresist stripping in order.

The insulation protective layer formed in the step 4 comprises a silicon nitride layer and an organic film layer located on the silicon nitride layer; a film thickness of the nitride layer of the insulation protective layer is 2000-5000 Å, and the nitride layer is formed by chemical vapor deposition; a film thickness of the organic film layer of the insulation protective layer is 0.2-0.4 μm, and the organic film layer is formed by coating; the step of patterning the insulation protective layer comprises photoresist coating, exposure, development, dry etching and photoresist stripping in order.

The transparent conductive layer is deposited by physical vapor deposition in the step 5, and a film thickness of the deposited transparent conductive layer is 400-1000 Å, and material of the transparent conductive layer is one or more of Indium Tin Oxide, Aluminum Tin Oxide, Aluminum Zinc Oxide, Indium Germanium Zinc Oxide; the step of patterning the transparent conductive layer comprises photoresist coating, exposure, development, wet etching and photoresist stripping in order.

The present invention further provides an IPS TFT-LCD array substrate, comprising a substrate, a plurality of gate scan lines located on the substrate, a plurality of data lines and a plurality of pixel units, divided by the plurality of gate scan lines and the plurality of data lines which are mutually insulated and staggered, and aligned in array;

each pixel unit comprises: a gate formed on the substrate, a gate isolation layer formed on the gate and the substrate, a semiconductor layer correspondingly above the gate and formed on the gate isolation layer, a source, a drain and a pixel electrode formed on the semiconductor layer and the gate isolation layer, an insulation protective layer formed on the source, the drain, the semiconductor layer and the gate isolation layer, and a pixel electrode and a common electrode formed on the insulation protective layer;

the source and the drain respectively contact with two ends of the semiconductor layer;

a via is provided in the insulation protective layer correspondingly located above the drain, and the pixel electrode contacts with the drain through the via;

a plurality of strip shape channels parallel with one another in the pixel area are provided on the insulation protective layer;

the pixel electrode and the common electrode are obtained after patterning the same transparent conductive layer, and the pixel electrode and the common electrode are separately located, and in each pixel area, the pixel electrode and the common electrode are alternately distributed along bosses at two sides of the channels and extend to side walls of the channels.

Material of the pixel electrode and the common electrode is transparent conductive material, and material of the transparent conductive material is one or more of Indium Tin Oxide, Aluminum Tin Oxide, Aluminum Zinc Oxide, Indium Germanium Zinc Oxide; film thicknesses of the pixel electrode and the common electrode are 400-1000 Å.

Material of the source-drain metal layer is a stack combination of one or more of molybdenum, titanium, aluminum and copper, and a film thickness of the source-drain metal layer is 3000-6000 Å.

The insulation protective layer comprises a silicon nitride layer and an organic film layer located on the silicon nitride layer, and a film thickness of the nitride layer of the insulation protective layer is 2000-5000 Å, and a film thickness of the organic film layer of the insulation protective layer is 0.2-0.4 μm.

The present invention further provides an IPS TFT-LCD array substrate, comprising a substrate, a plurality of gate scan lines located on the substrate, a plurality of data lines and a plurality of pixel units, divided by the plurality of gate scan lines and the plurality of data lines which are mutually insulated and staggered, and aligned in array;

each pixel unit comprises: a gate formed on the substrate, a gate isolation layer formed on the gate and the substrate, a semiconductor layer correspondingly above the gate and formed on the gate isolation layer, a source, a drain and a pixel electrode formed on the semiconductor layer and the gate isolation layer, an insulation protective layer formed on the source, the drain, the semiconductor layer and the gate isolation layer, and a pixel electrode and a common electrode formed on the insulation protective layer;

the source and the drain respectively contact with two ends of the semiconductor layer;

a via is provided in the insulation protective layer correspondingly located above the drain, and the pixel electrode contacts with the drain through the via;

a plurality of strip shape channels parallel with one another in the pixel area are provided on the insulation protective layer;

the pixel electrode and the common electrode are obtained after patterning the same transparent conductive layer, and the pixel electrode and the common electrode are separately located, and in each pixel area, the pixel electrode and the common electrode are alternately distributed along bosses at two sides of the channels and extend to side walls of the channels;

wherein material of the pixel electrode and the common electrode is transparent conductive material, and material of the transparent conductive material is one or more of Indium Tin Oxide, Aluminum Tin Oxide, Aluminum Zinc Oxide, Indium Germanium Zinc Oxide; film thicknesses of the pixel electrode and the common electrode are 400-1000 Å.

wherein material of the source-drain metal layer is a stack combination of one or more of molybdenum, titanium, aluminum and copper, and a film thickness of the source-drain metal layer is 3000-6000 Å;

wherein the insulation protective layer comprises a silicon nitride layer and an organic film layer located on the silicon nitride layer, and a film thickness of the nitride layer of the insulation protective layer is 2000-5000 Å, and a film thickness of the organic film layer of the insulation protective layer is 0.2-0.4 μm.

The benefits of the present invention are: in the manufacture method of the IPS TFT-LCD array substrate according to the present invention, the pixel electrode and the common electrode are manufactured with the same transparent conductive layer, and a plurality of strip shape channels parallel with one another in the pixel area are provided on the insulation protective layer below the pixel electrode and the common electrode, and the pixel electrode and the common electrode are alternately distributed along bosses at two sides of the channels and extend to side walls of the channels, and thus to increase the areas of the pixel electrode and the common electrode in the direction vertical to the substrate, and to increase the horizontal electrical field, and meanwhile to increase the storage capacitor, and thus to promote the display quality of the liquid crystal panel; in the IPS TFT-LCD array substrate according to the present invention, the pixel electrode and the common electrode utilizes the same layer design, and a plurality of strip shape channels parallel with one another in the pixel area are provided on the insulation protective layer below the pixel electrode and the common electrode, and the pixel electrode and the common electrode are alternately distributed along bosses at two sides of the channels and extend to side walls of the channels, and thus to increase the areas of the pixel electrode and the common electrode in the direction vertical to the substrate, and to increase the horizontal electrical field, and meanwhile to increase the storage capacitor, and thus to promote the display quality of the liquid crystal panel.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
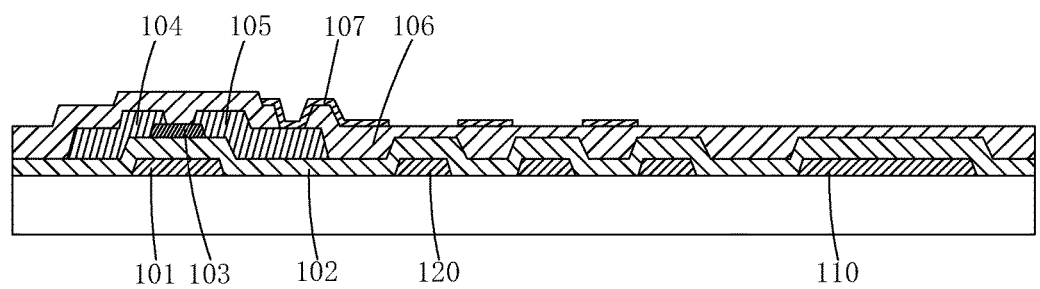
FIG. 1 is a structure diagram of an IPS TFT-LCD array substrate according to prior art.
Figure 2:
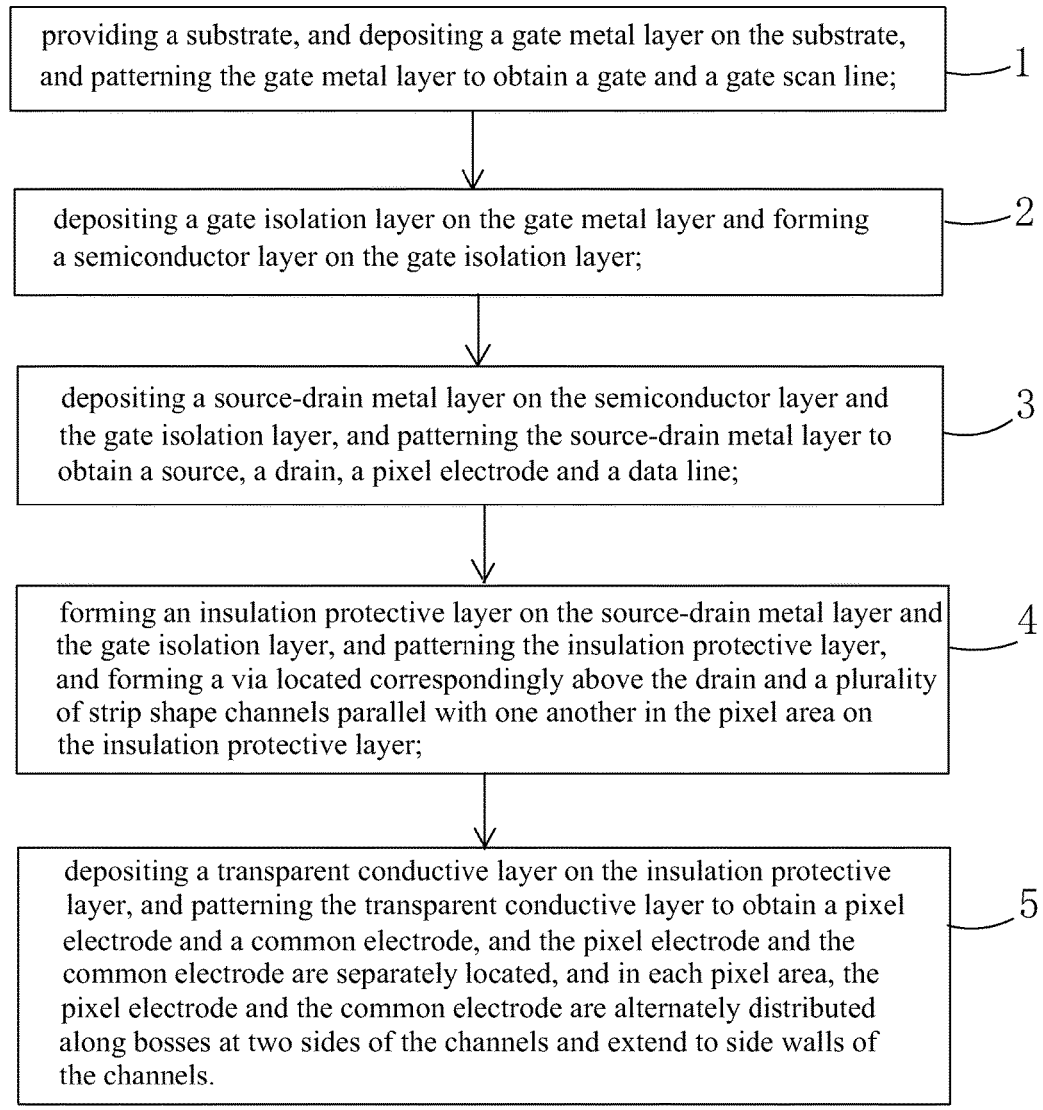
FIG. 2 is a flowchart of a manufacture method of an IPS TFT-LCD array substrate according to the present invention.
Figure 3:
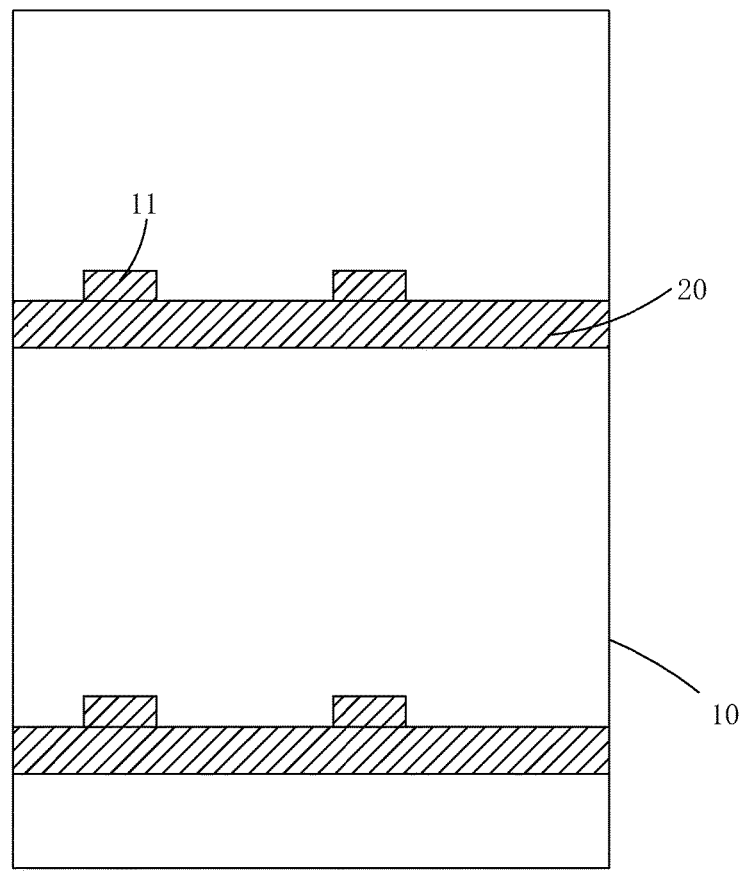
FIGS. 3-4 are diagrams of the step 1 of the manufacture method of the IPS TFT-LCD array substrate according to the present invention.
Figure 4:
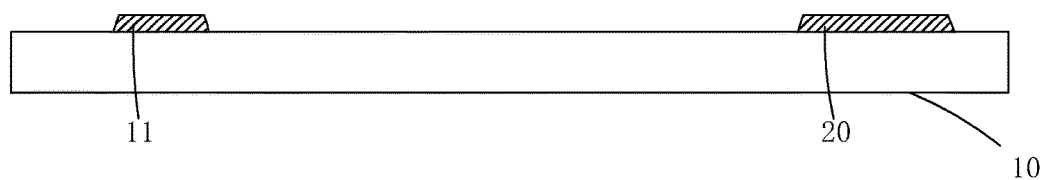
Figure 5:
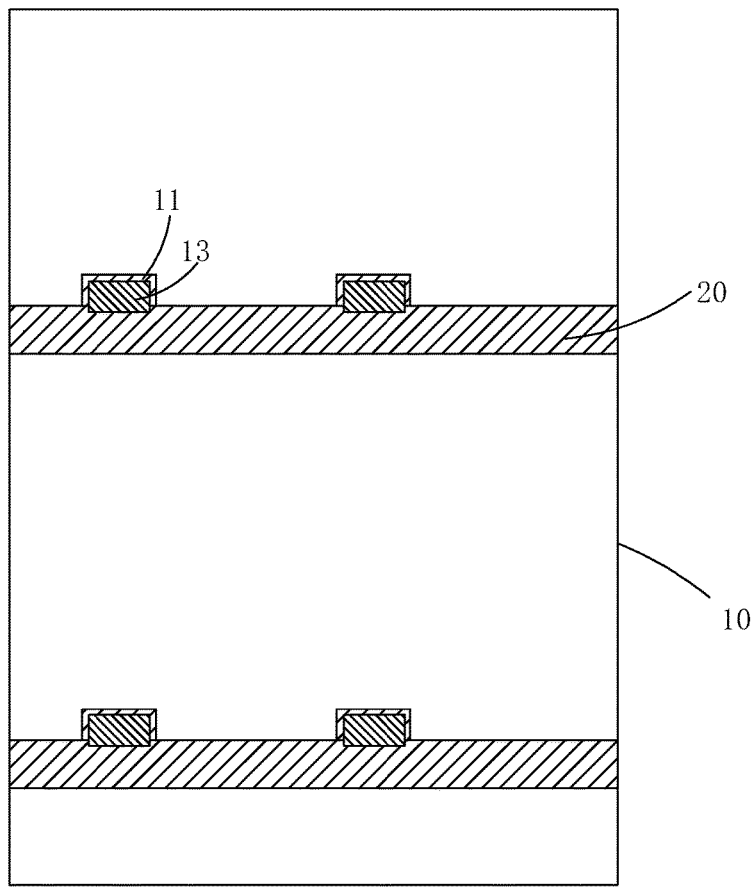
FIGS. 5-6 are diagrams of the step 2 of the manufacture method of the IPS TFT-LCD array substrate according to the present invention.
Figure 6:
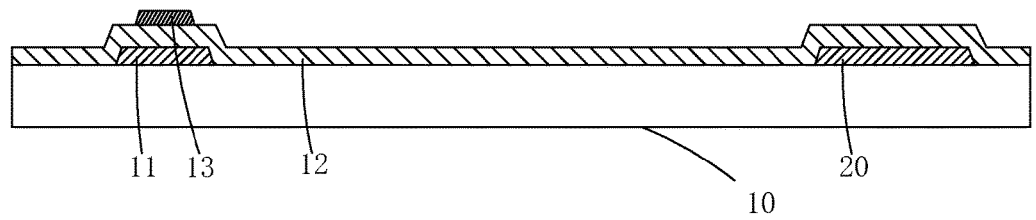

Please refer to FIG. 2, the present invention provides a manufacture method of an IPS TFT-LCD array substrate, comprising steps of:

step 1, as shown in FIGS. 3-4, providing a substrate 10, and depositing a gate metal layer on the substrate 10, and patterning the gate metal layer to obtain a gate 11 and a gate scan line 20.

specifically, the gate metal layer is deposited by physical vapor deposition (PVD) in the step 1, and a film thickness of the deposited gate metal layer is 3000-6000 Å, and material of the gate metal layer is a stack combination of one or more of molybdenum, titanium, aluminum and copper; the step of patterning the gate metal layer comprises photoresist coating, exposure, development, wet etching and photoresist stripping in order.

step 2, as shown in FIGS. 5-6, depositing a gate isolation layer 12 on the gate metal layer, and depositing an amorphous silicon layer on the gate isolation layer 12, and patterning the amorphous silicon layer after performing N-type doping to the amorphous silicon layer to obtain a semiconductor layer 13 above the gate.

specifically, the gate isolation layer 12 and the amorphous silicon layer are deposited by chemical vapor deposition (CVD) in the step 2, and a film thickness of the deposited gate isolation layer 12 is 2000-5000 Å, and a film thickness of the deposited amorphous silicon layer is 1500-3000 Å; the gate isolation layer is a silicon nitride layer, and the step of patterning the amorphous silicon layer comprises photoresist coating, exposure, development, wet etching and photoresist stripping in order.

Figure 7:
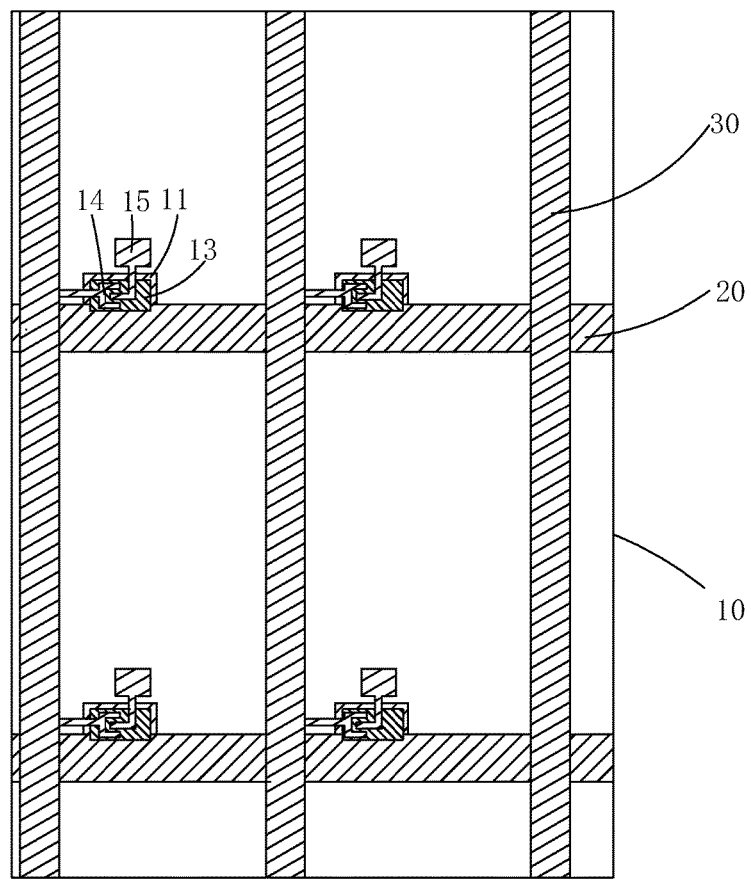
FIGS. 7-8 are diagrams of the step 3 of the manufacture method of the IPS TFT-LCD array substrate according to the present invention.
Figure 8:
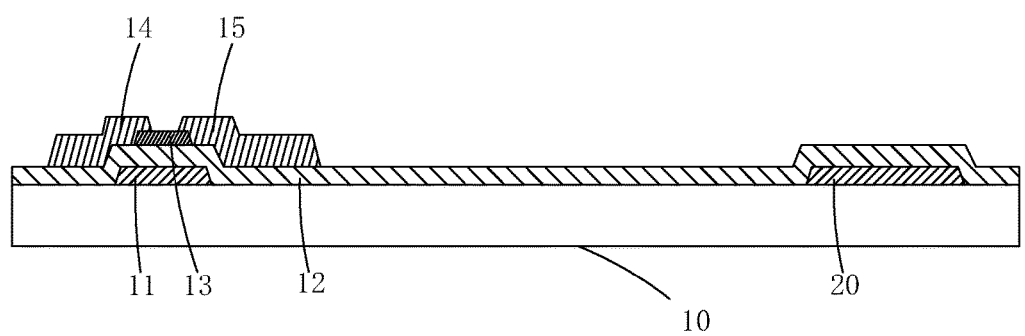

Preferably, the gate isolation layer 12 is a silicon nitride layer.

step 3, as shown in FIGS. 7-8, depositing a source-drain metal layer on the semiconductor layer 13 and the gate isolation layer 12, and patterning the source-drain metal layer to obtain a source 14, a drain 15 and a data line 30, and the source 14 and the drain 15 respectively contact with two ends of the semiconductor layer 13; wherein the data line 30 and the gate scan line 20 crisscross to form a plurality of pixel areas.

Figure 9:
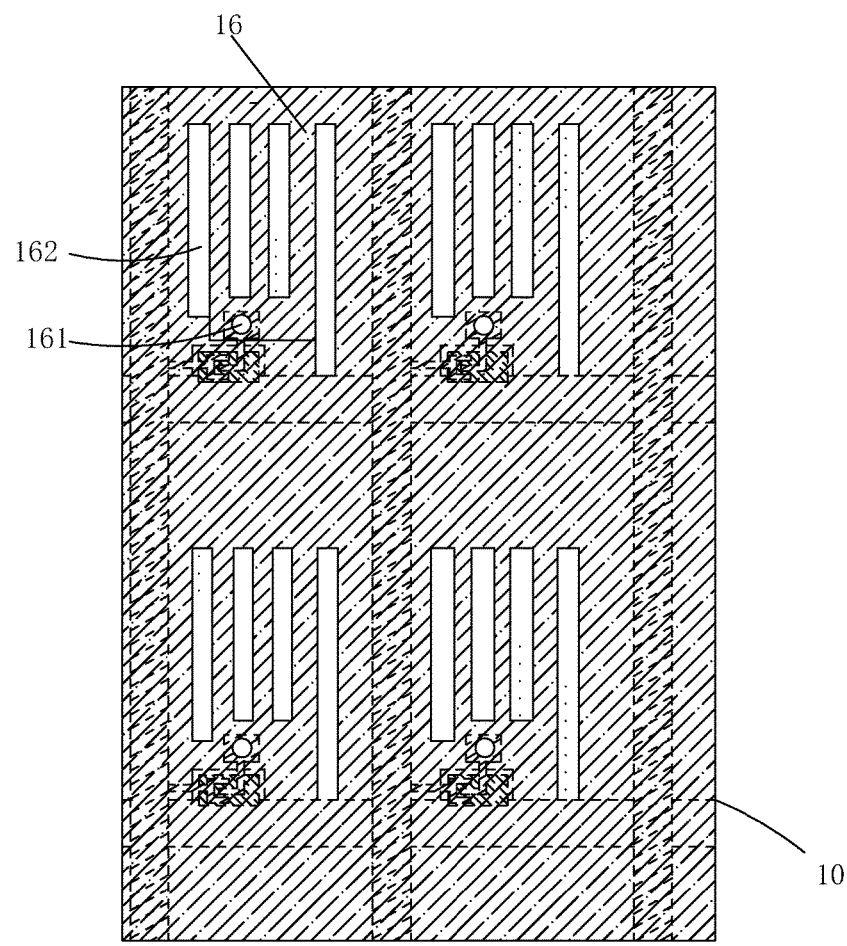
FIGS. 9-10 are diagrams of the step 4 of the manufacture method of the IPS TFT-LCD array substrate according to the present invention.
Figure 10:
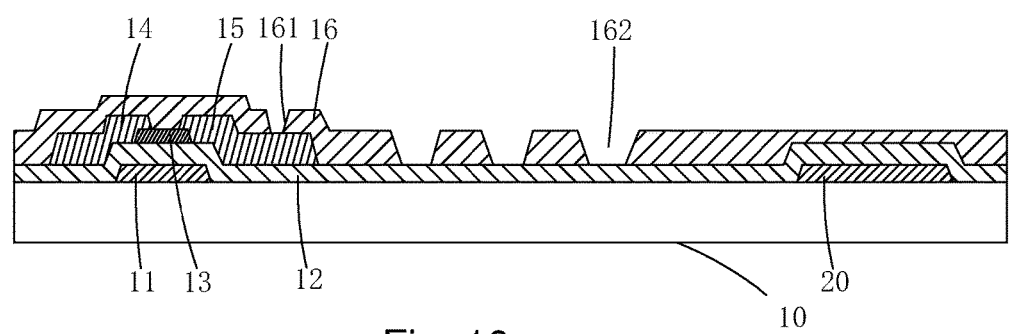

Specifically, the source-drain metal layer is deposited by physical vapor deposition in the step 3, and a film thickness of the deposited source-drain metal layer is 3000-6000 Å, and material of the source-drain metal layer is a stack combination of one or more of molybdenum, titanium, aluminum and copper; the step of patterning the source-drain metal layer comprises photoresist coating, exposure, development, wet etching and photoresist stripping in order.

step 4, as shown in FIGS. 9-10, forming an insulation protective layer 16 on the source-drain metal layer, and patterning the insulation protective layer 16, and forming a via 161 located correspondingly above the drain 15 and a plurality of strip shape channels 162 parallel with one another in the pixel area on the insulation protective layer.

Specifically, the insulation protective layer 16 formed in the step 4 comprises a silicon nitride layer and an organic film layer located on the silicon nitride layer; a film thickness of the nitride layer of the insulation protective layer 16 is 2000-5000 Å, and the nitride layer is formed by chemical vapor deposition; a film thickness of the organic film layer of the insulation protective layer 16 is 0.2-0.4 μm, and the organic film layer is formed by coating. The organic film layer of the insulation protective layer 16 is employed to increase the thickness of the insulation protective layer 16, and thus to increase the depth of the channel 162. Consequently, the extending lengths of the pixel electrode 17 and the common electrode 18 formed in the following step 5 on the side wall of the channel 162 are increased, and thus to increase the areas of the pixel electrode 17 and the common electrode 18 in the direction vertical to the substrate.

Figure 11:
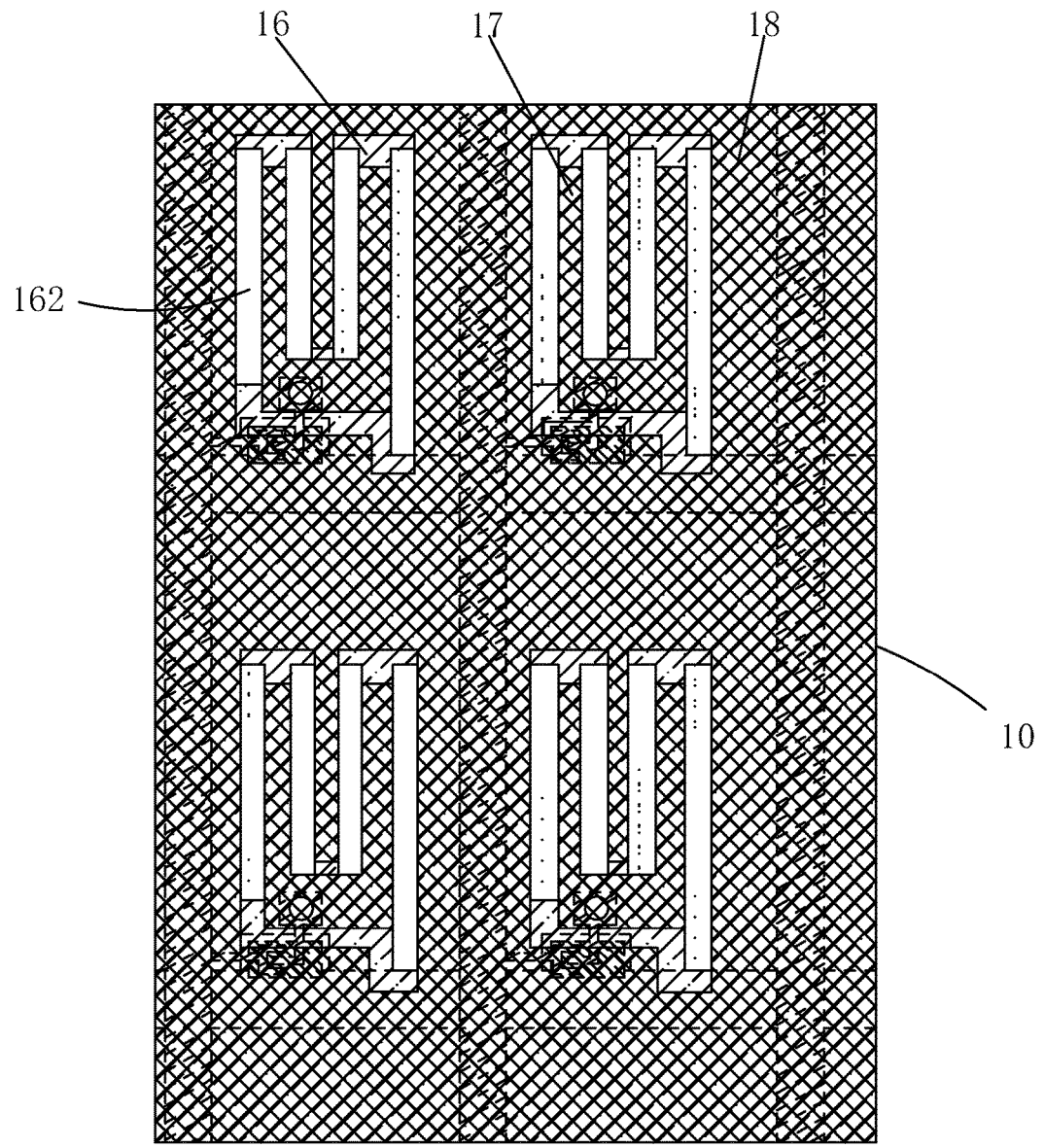
FIG. 11 is a diagram of the step 5 of the manufacture method of the IPS TFT-LCD array substrate according to the present invention.
Figure 12:
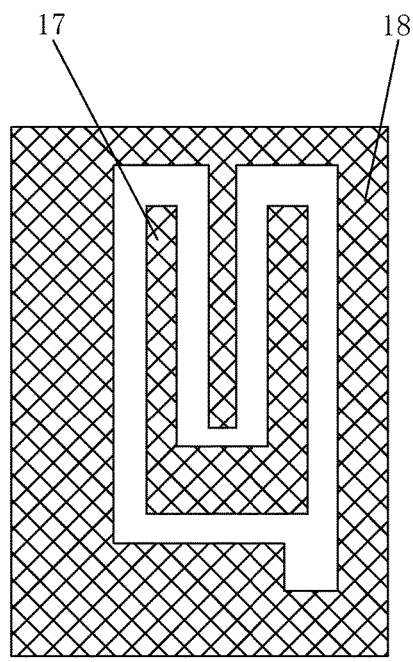
FIG. 12 is a diagram of a pixel electrode and a common electrode formed in one pixel area in the step 5 of the manufacture method of the IPS TFT-LCD array substrate according to the present invention.
Figure 13:
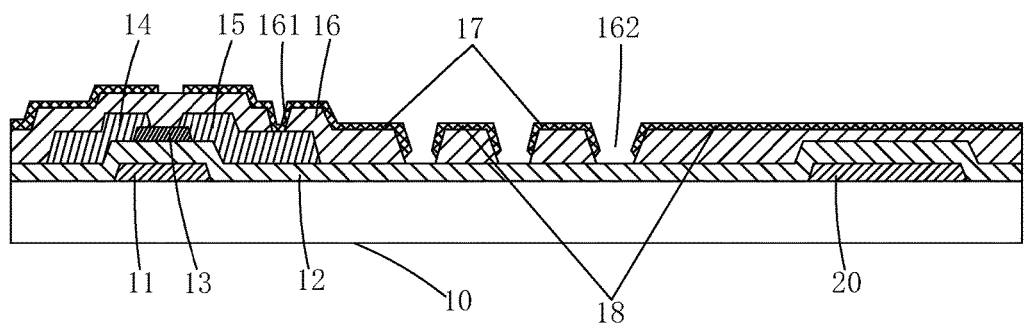
FIG. 13 is a diagram of the step 5 of the manufacture method of the IPS TFT-LCD array substrate according to the present invention and also a structure diagram of the IPS TFT-LCD array substrate according to the present invention.

Specifically, the step of patterning the insulation protective layer 16 comprises photoresist coating, exposure, development, wet etching and photoresist stripping in order.

step 5, as shown in FIGS. 11-13, depositing a transparent conductive layer on the insulation protective layer 16, and patterning the transparent conductive layer to obtain a pixel electrode 17 and a common electrode 18, and the pixel electrode 17 contacts with the drain 15 through the via 161, and the pixel electrode 17 and the common electrode 18 are separately located, and in each pixel area, the pixel electrode 17 and the common electrode 18 are alternately distributed along bosses at two sides of the channels 162 and extend to side walls of the channels 162.

Specifically, the transparent conductive layer is deposited by physical vapor deposition in the step 5, and a film thickness of the deposited transparent conductive layer is 400-1000 Å, and material of the transparent conductive layer is one or more of Indium Tin Oxide, Aluminum Tin Oxide, Aluminum Zinc Oxide, Indium Germanium Zinc Oxide; the step of patterning the transparent conductive layer comprises photoresist coating, exposure, development, wet etching and photoresist stripping in order.

Preferably, material of the deposited transparent conductive layer is Indium Tin Oxide (ITO).

Please refer to FIG. 13. On the basis of the aforesaid manufacture method of the IPS TFT-LCD array substrate, the present invention further provides an IPS TFT-LCD array substrate comprising a substrate 10, a plurality of gate scan lines 20 located on the substrate 10, a plurality of data lines 30 and a plurality of pixel units, divided by the plurality of gate scan lines 20 and the plurality of data lines 30 which are mutually insulated and staggered, and aligned in array;

each pixel unit comprises: a gate 11 formed on the substrate 10, a gate isolation layer 12 formed on the gate 11 and the substrate 10, a semiconductor layer 13 correspondingly above the gate 11 and formed on the gate isolation layer 12, a source 14 and a drain 15 formed on the semiconductor layer 13 and the gate isolation layer 12, an insulation protective layer 16 formed on the source 14, the drain 15, the semiconductor layer 13 and the gate isolation layer 12, and a pixel electrode 17 and a common electrode 18 formed on the insulation protective layer 16;

the source 14 and the drain 15 respectively contact with two ends of the semiconductor layer 13;

a via 161 is provided in the insulation protective layer 16 correspondingly located above the drain 15, and the pixel electrode 17 contacts with the drain 15 through the via 161;

a plurality of strip shape channels 162 parallel with one another in the pixel area are provided on the insulation protective layer 16;

the pixel electrode 17 and the common electrode 18 are obtained after patterning the same transparent conductive layer, and the pixel electrode 17 and the common electrode 18 are separately located, and in each pixel area, the pixel electrode 17 and the common electrode 18 are alternately distributed along bosses at two sides of the channels 162 and extend to side walls of the channels 162.

Specifically, material of the pixel electrode 17 and the common electrode 18 is transparent conductive material, and material of the transparent conductive material is one or more of Indium Tin Oxide, Aluminum Tin Oxide, Aluminum Zinc Oxide, Indium Germanium Zinc Oxide; film thicknesses of the pixel electrode 17 and the common electrode 18 are 400-1000 Å.

Preferably, material of the pixel electrode 17 and the common electrode 21 is Indium Tin Oxide.

Specifically, material of the source-drain metal layer is a stack combination of one or more of molybdenum, titanium, aluminum and copper, and a film thickness of the source-drain metal layer is 3000-6000 Å.

Specifically, the insulation protective layer 16 comprises a silicon nitride layer and an organic film layer located on the silicon nitride layer, and a film thickness of the nitride layer of the insulation protective layer 16 is 2000-5000 Å, and a film thickness of the organic film layer of the insulation protective layer 16 is 0.2-0.4 μm. The organic film layer of the insulation protective layer 16 is employed to increase the thickness of the insulation protective layer 16, and thus to increase the depth of the channel 162. Consequently, the extending lengths of the pixel electrode 17 and the common electrode 18 formed in the following step 5 on the side wall of the channel 162 are increased, and thus to increase the areas of the pixel electrode 17 and the common electrode 18 in the direction vertical to the substrate.

In conclusion, in the manufacture method of the IPS TFT-LCD array substrate according to the present invention, the pixel electrode and the common electrode are manufactured with the same transparent conductive layer, and a plurality of strip shape channels parallel with one another in the pixel area are provided on the insulation protective layer below the pixel electrode and the common electrode, and the pixel electrode and the common electrode are alternately distributed along bosses at two sides of the channels and extend to side walls of the channels, and thus to increase the areas of the pixel electrode and the common electrode in the direction vertical to the substrate, and to increase the horizontal electrical field, and meanwhile to increase the storage capacitor, and thus to promote the display quality of the liquid crystal panel; in the IPS TFT-LCD array substrate according to the present invention, the pixel electrode and the common electrode utilizes the same layer design, and a plurality of strip shape channels parallel with one another in the pixel area are provided on the insulation protective layer below the pixel electrode and the common electrode, and the pixel electrode and the common electrode are alternately distributed along bosses at two sides of the channels and extend to side walls of the channels, and thus to increase the areas of the pixel electrode and the common electrode in the direction vertical to the substrate, and to increase the horizontal electrical field, and meanwhile to increase the storage capacitor, and thus to promote the display quality of the liquid crystal panel.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an IPS TFT-LCD array substrate, comprising steps of:
    step 1, providing a substrate, and depositing a gate metal layer on the substrate, and patterning the gate metal layer to obtain a gate and a gate scan line;
    step 2, depositing a gate isolation layer on the gate metal layer, and depositing an amorphous silicon layer on the gate isolation layer, and patterning the amorphous silicon layer after performing N-type doping to the amorphous silicon layer to obtain a semiconductor layer correspondingly above the gate;
    step 3, depositing a source-drain metal layer on the semiconductor layer and the gate isolation layer, and patterning the source-drain metal layer to obtain a source, a drain and a data line, and the source and the drain respectively contact with two ends of the semiconductor layer; wherein the data line and the gate scan line crisscross to form a plurality of pixel areas;
    step 4, forming an insulation protective layer on the source-drain metal layer, and patterning the insulation protective layer, and forming a via located correspondingly above the drain and a plurality of strip shape channels parallel with one another in the pixel area on the insulation protective layer;
    step 5, depositing a transparent conductive layer on the insulation protective layer, and patterning the transparent conductive layer to obtain a pixel electrode and a common electrode, and the pixel electrode contacts with the drain through the via, and the pixel electrode and the common electrode are separately located, and in each pixel area, the pixel electrode and the common electrode are alternately distributed along bosses at two sides of the channels and extend to side walls of the channels.

2. The manufacture method of the IPS TFT-LCD array substrate according to claim 1, wherein the gate metal layer is deposited by physical vapor deposition in the step 1, and a film thickness of the deposited gate metal layer is 3000-6000 Å, and material of the gate metal layer is a stack combination of one or more of molybdenum, titanium, aluminum and copper; the step of patterning the gate metal layer comprises photoresist coating, exposure, development, wet etching and photoresist stripping in order.

3. The manufacture method of the IPS TFT-LCD array substrate according to claim 1, wherein the gate isolation layer and the amorphous silicon layer are deposited by chemical vapor deposition in the step 2, and a film thickness of the deposited gate isolation layer is 2000-5000 Å, and a film thickness of the deposited amorphous silicon layer is 1500-3000 Å, and the gate isolation layer is a silicon nitride layer, and the step of patterning the amorphous silicon layer comprises photoresist coating, exposure, development, wet etching and photoresist stripping in order.

4. The manufacture method of the IPS TFT-LCD array substrate according to claim 1, wherein the source-drain metal layer is deposited by physical vapor deposition in the step 3, and a film thickness of the deposited gate metal layer is 3000-6000 Å, and material of the source-drain metal layer is a stack combination of one or more of molybdenum, titanium, aluminum and copper; the step of patterning the source-drain metal layer comprises photoresist coating, exposure, development, wet etching and photoresist stripping in order.

5. The manufacture method of the IPS TFT-LCD array substrate according to claim 1, wherein the insulation protective layer formed in the step 4 comprises a silicon nitride layer; a film thickness of the nitride layer of the insulation protective layer is 2000-5000 Å, and the nitride layer is formed by chemical vapor deposition the step of patterning the insulation protective layer comprises photoresist coating, exposure, development, dry etching and photoresist stripping in order.

6. The manufacture method of the IPS TFT-LCD array substrate according to claim 1, wherein the transparent conductive layer is deposited by physical vapor deposition in the step 5, and a film thickness of the deposited transparent conductive layer is 400-1000 Å, and material of the transparent conductive layer is one or more of Indium Tin Oxide, Aluminum Tin Oxide, Aluminum Zinc Oxide, Indium Germanium Zinc Oxide; the step of patterning the transparent conductive layer comprises photoresist coating, exposure, development, wet etching and photoresist stripping in order.

7. An IPS TFT-LCD array substrate, comprising a substrate, a plurality of gate scan lines located on the substrate, a plurality of data lines and a plurality of pixel units, divided by the plurality of gate scan lines and the plurality of data lines which are mutually insulated and staggered, and aligned in array;
    each pixel unit comprises: a gate formed on the substrate, a gate isolation layer formed on the gate and the substrate, a semiconductor layer correspondingly above the gate and formed on the gate isolation layer, a source, a drain and a pixel electrode formed on the semiconductor layer and the gate isolation layer, an insulation protective layer formed on the source, the drain, the semiconductor layer and the gate isolation layer, and a pixel electrode and a common electrode formed on the insulation protective layer;
    the source and the drain respectively contact with two ends of the semiconductor layer;
    a via is provided in the insulation protective layer correspondingly located above the drain, and the pixel electrode contacts with the drain through the via;

a plurality of strip shape channels parallel with one another in a pixel area are provided on the insulation protective layer;

the pixel electrode and the common electrode are obtained after patterning the same transparent conductive layer, and the pixel electrode and the common electrode are separately located, and in each pixel area, the pixel electrode and the common electrode are alternately distributed along bosses at two sides of the channels and extend to side walls of the channels.

8. The IPS TFT-LCD array substrate according to claim 7, wherein material of the pixel electrode and the common electrode is transparent conductive material, and material of the transparent conductive material is one or more of Indium Tin Oxide, Aluminum Tin Oxide, Aluminum Zinc Oxide, Indium Germanium Zinc Oxide; film thicknesses of the pixel electrode and the common electrode are 400-1000 Å.

9. The IPS TFT-LCD array substrate according to claim 7, wherein material of the source-drain metal layer is a stack combination of one or more of molybdenum, titanium, aluminum and copper, and a film thickness of the source-drain metal layer is 3000-6000 Å.

10. The IPS TFT-LCD array substrate according to claim 7, wherein the insulation protective layer comprises a silicon nitride layer, and a film thickness of the nitride layer of the insulation protective layer is 2000-5000 Å.

11. An IPS TFT-LCD array substrate, comprising a substrate, a plurality of gate scan lines located on the substrate, a plurality of data lines and a plurality of pixel units, divided by the plurality of gate scan lines and the plurality of data lines which are mutually insulated and staggered, and aligned in array;

each pixel unit comprises: a gate formed on the substrate, a gate isolation layer formed on the gate and the substrate, a semiconductor layer correspondingly above the gate and formed on the gate isolation layer, a source, a drain and a pixel electrode formed on the semiconductor layer and the gate isolation layer, an insulation protective layer formed on the source, the drain, the semiconductor layer and the gate isolation layer, and a pixel electrode and a common electrode formed on the insulation protective layer;

the source and the drain respectively contact with two ends of the semiconductor layer;

a via is provided in the insulation protective layer correspondingly located above the drain, and the pixel electrode contacts with the drain through the via;

a plurality of strip shape channels parallel with one another in the pixel area are provided on the insulation protective layer;

the pixel electrode and the common electrode are obtained after patterning the same transparent conductive layer, and the pixel electrode and the common electrode are separately located, and in each pixel area, the pixel electrode and the common electrode are alternately distributed along bosses at two sides of the channels and extend to side walls of the channels;

wherein material of the pixel electrode and the common electrode is transparent conductive material, and material of the transparent conductive material is one or more of Indium Tin Oxide, Aluminum Tin Oxide, Aluminum Zinc Oxide, Indium Germanium Zinc Oxide; film thicknesses of the pixel electrode and the common electrode are 400-1000 Å;

wherein material of the source-drain metal layer is a stack combination of one or more of molybdenum, titanium, aluminum and copper, and a film thickness of the source-drain metal layer is 3000-6000 Å;

wherein the insulation protective layer comprises a silicon nitride layer, and a film thickness of the nitride layer of the insulation protective layer is 2000-5000 Å.

* * * * *